United States Patent
Hayashi et al.

(10) Patent No.: US 8,034,250 B2
(45) Date of Patent: Oct. 11, 2011

(54) PIEZOELECTRIC MATERIAL

(75) Inventors: Jumpei Hayashi, Yokohama (JP); Zuyi Zhang, Yokohama (JP); Toshihiro Ifuku, Yokohama (JP); Satoshi Wada, Kofu (JP); Keisuke Yamato, Kofu (JP); Nobuhiro Kumada, Kofu (JP); Masaki Azuma, Uji (JP); Hiroshi Funakubo, Yokohama (JP); Takashi Iijima, Tsukuba (JP); Soichiro Okamura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/922,824

(22) PCT Filed: Mar. 18, 2009

(86) PCT No.: PCT/JP2009/056021
§ 371 (c)(1),
(2), (4) Date: Sep. 15, 2010

(87) PCT Pub. No.: WO2009/116683
PCT Pub. Date: Sep. 24, 2009

(65) Prior Publication Data
US 2011/0012050 A1  Jan. 20, 2011

(30) Foreign Application Priority Data

Mar. 19, 2008 (JP) .................. 2008-072321

(51) Int. Cl.
C04B 35/00 (2006.01)
C04B 35/495 (2006.01)
(52) U.S. Cl. ............. 252/62.9 PZ; 252/62.9 R; 501/134
(58) Field of Classification Search ............. 252/62.9 R, 252/62.9 PZ; 310/358; 501/10, 134, 135, 501/136, 137; 117/949
See application file for complete search history.

(56) References Cited

U.S. PATENT DOCUMENTS 5,164,349 A * 11/1992 Fujii et al. ............... 501/134
7,205,256 B2 * 4/2007 Kijima et al. ............ 502/232
(Continued)

FOREIGN PATENT DOCUMENTS

EP    0581481 A2    2/1994
(Continued)

OTHER PUBLICATIONS

Matthew R. Suchomel et al., "Bi2ZnTiO6: A Lead-Free Closed-Shell Polar Perovskite with a Calculated Ionic Polarization of 150 μC cm-2," 18(21) Chem. Mater. 4987-4989 (Sep. 2006).

(Continued)

*Primary Examiner* — Jerry A Lorengo
*Assistant Examiner* — Lynne Edmondson
(74) *Attorney, Agent, or Firm* — Fitzpatrick, Cella, Harper & Scinto

(57) ABSTRACT

Provided is a piezoelectric material including a lead-free perovskite-type composite oxide which is excellent in piezoelectric characteristics and temperature characteristics and is represented by the general formula (1):

$$xABO_3\text{-}yA'BO_3\text{-}zA''B'O_3$$

in which A is a Bi element; A' is a rare earth element including La; B is at least one element selected from Ti, Zn, Sn and Zr; A" is at least one element selected from Ba, Sr and Ca; B' is at least one element selected from divalent, trivalent, pentavalent, tetravalent, and hexavalent elements; and x is a value of 0.10 or more and 0.95 or less, y is a value of 0 or more and 0.5 or less, and z is a value of 0 or more and 0.7 or less, provided that x+y+z=1.

5 Claims, 3 Drawing Sheets

U.S. PATENT DOCUMENTS

| | | | |
|---|---|---|---|
| 7,525,239 B2* | 4/2009 | Aoki et al. | 310/358 |
| 2003/0134738 A1 | 7/2003 | Furukawa et al. | |
| 2004/0119054 A1* | 6/2004 | Li et al. | 252/500 |
| 2004/0139911 A1 | 7/2004 | Chiang et al. | |
| 2005/0109263 A9 | 5/2005 | Chiang et al. | |
| 2006/0045840 A1* | 3/2006 | Chen et al. | 423/598 |
| 2006/0172880 A1* | 8/2006 | Shirakawa et al. | 501/137 |
| 2007/0090730 A1* | 4/2007 | Fukui et al. | 310/358 |
| 2009/0315432 A1 | 12/2009 | Furuta et al. | |
| 2010/0025617 A1* | 2/2010 | Kubota et al. | 252/62.9 PZ |
| 2010/0025618 A1 | 2/2010 | Watanabe et al. | |
| 2010/0081559 A1* | 4/2010 | Zhang et al. | 501/137 |
| 2010/0155646 A1 | 6/2010 | Furuta et al. | |
| 2010/0155647 A1 | 6/2010 | Saito et al. | |

FOREIGN PATENT DOCUMENTS

| | | |
|---|---|---|
| EP | 1612195 A1 | 1/2006 |
| EP | 1690843 A1 | 8/2006 |

OTHER PUBLICATIONS

Hajime Nagata et al., "Piezoelectric Properties of Bismuth Sodium Titanate Ceramics," Ceramic Transactions, 167(2) 213-221 (2005).

Chien-Chih Huang et al., "Phase Transitions and Ferroelectric Properties in $BiScO_3-Bi(Zn_{1/2}Ti_{1/2})O_3-BaTiO_3$ Solid Solutions," 102 J. Appl. Phys. 044103 (1-5) (2007).

Matthew R. Suchomel et al., "$Bi_2ZnTiO_6$: A Lead-Free Closed-Shell Polar Perovskite with a Calculated Ionic Polarization of 150 μC cm-2,"—Additions and Corrections, 18 Chem. Mater. 5810 (Nov. 2006).

P. H. Fang et al., "Ferroelectricity in the Compound $Bi_4Ti_3O_{12}$," 126 Phys. Rev. 893-896 (May 1962).

Qun-bao Yang et al., "New Development of Study on Lead-free Piezoelectric Ceramics," 23(11) Electronic Components & Materials 56-65 (Nov. 2004).

* cited by examiner

PIEZOELECTRIC MATERIAL

TECHNICAL FIELD

The present invention relates to a piezoelectric material and in particular to a novel lead-free piezoelectric material having a high Curie temperature.

BACKGROUND ART

There is a market in which a piezoelectric material composed of an $ABO_3$ perovskite-type oxide is used as an ink jet head or an ultrasonic transducer. The piezoelectric material used in the field is mainly lead zirconate titanate (PZT).

However, PZT contains lead as an element in the A site and is thus considered problematic for its influence on the environment. Accordingly, piezoelectric materials using lead-free perovskite-type oxides have been proposed.

As piezoelectric materials consisting of lead-free perovskite-type oxides, those materials including Bi as an element in the A site have been extensively studied. For example, Bi $(Zn_{0.5}, Ti_{0.5}) O_3$ is described in Matthew R. Suchomel, et al. in Chem. Mater. 2006, 18, 4987-4989. According to a theoretical calculation in simulations, Bi $(Zn_{0.5}, Ti_{0.5}) O_3$ has been reported to have high piezoelectric properties or a high Curie temperature. However, the poling procedure of Bi $(Zn_{0.5}, Ti_{0.5}) O_3$ has been known to be difficult, and there is no example of reports in which its poling procedure was successfully achieved and its piezoelectric characteristics and Curie temperature were actually measured. The difficulty in poling procedure of Bi $(Zn_{0.5}, Ti_{0.5}) O_3$ is considered attributable to its high Curie temperature and high anisotropy (c/a=1.21), but the reason for the difficulty is not revealed.

Because of the difficulty in poling procedure of Bi $(Zn_{0.5}, Ti_{0.5}) O_3$, expected high piezoelectric characteristics cannot be exhibited, thus making its applications limited.

H. Nagata, et al., Ceramic Transactions, Vol. 167, No. 2, pp. 213 to 221, 2005 have described $(Bi_{0.5}, Na_{0.5}) TiO_3$, that is, a material having Bi and Na employed as a composite in the A site.

However, although $(Bi_{0.5}, Na_{0.5}) TiO_3$ exhibits excellent piezoelectric characteristics at or near room temperature, there is a problem that it shows abrupt degradation in the piezoelectric characteristics at 150° C. or more and is therefore not suitable for use in devices that operate at high temperatures.

Further, when an alkali metal is contained as a component in a piezoelectric body, the piezoelectric body when used as a thin film is not suitable for silicon process because of its deliquescency or the like, thus posing the problem of durability as a bulk piezoelectric body used in devices such as piezoelectric transducers. Accordingly, the piezoelectric material is desirably free from an alkali metal.

The present invention has been accomplished in light of such background art and provides a piezoelectric material having a high Curie temperature and solving the difficulty in poling procedure, employing a Bi-based piezoelectric body which is excellent in performance as the piezoelectric body.

DISCLOSURE OF THE INVENTION

The piezoelectric material solving the above problem includes a perovskite-type composite oxide represented by the general formula (1):

General Formula (1)

wherein A is a Bi element; A' is a rare earth element including La; B is at least one element selected from Ti, Zn, Sn and Zr; A" is at least one element selected from Ba, Sr and Ca; B' is at least one element selected from divalent, trivalent, pentavalent, tetravalent, and hexavalent elements; and x is a value of 0.10 or more and 0.95 or less, y is 0 or more and 0.5 or less, and z is 0 or more and 0.7 or less, provided that x+y+z=1.

B in the formula (1) preferably consists of Zn and Ti.

B' in $A"B'O_3$ in the formula (1) is preferably at least one element selected from $Sc^{3+}$, $Fe^{3+}$, $Yb^{3+}$, $Mg^{2+}$, $Mn^{2+}$, $Mn^{3+}$, $Co^{2+}$, $Zn^{2+}$, $In^{3+}$, $Ti^{4+}$, $Zr^{4+}$, $Sn^{4+}$, $Nb^{5+}$, $Ta^{5+}$ and $Te^{6+}$.

$A"B'O_3$ in the formula (1) is preferably $BaTiO_3$.

The perovskite-type composite oxide represented by the general formula (1) wherein x+y+z=1 preferably has a composition wherein the values of (x, y, z) are within the range of molar ratios surrounded by a, b, c, d, e, f, and g represented by a (0.40, 0.00, 0.60), b (0.26, 0.08, 0.66), c (0.20, 0.20, 0.60), d (0.30, 0.44, 0.26), e (0.52, 0 39, 0.09), f (0.70, 0.24, 0.06), and g (0.90, 0.00, 0.10).

The present invention can provide a piezoelectric material excellent in piezoelectric characteristics having a high Curie temperature. The difficulty in the poling procedure of Bi $(Zn_{0.5}, Ti_{0.5}) O_3$ can be solved, and the excellent characteristics of Bi $(Zn_{0.5}, Ti_{0.5}) O_3$ can be utilized.

Furthermore, the piezoelectric material of the present invention does not use lead, thus exerting no influence on the environment, and does not use an alkali metal, thus being advantageous in durability when used in piezoelectric elements.

Further features of the present invention will become apparent from the following description of exemplary embodiments with reference to the attached drawings.

BEST MODE FOR CARRYING OUT THE INVENTION

Hereinafter, the present invention is described in detail.

The present invention provides a novel piezoelectric material which is excellent in piezoelectric characteristics and temperature characteristics and is free from significant difficulty in poling procedure, based on a Bi piezoelectric body, which as the piezoelectric body, is excellent in performance.

The present invention provides a lead-free piezoelectric material having a high Curie temperature as specific temperature characteristics. The present invention can provide a material, which because of its high Curie temperature, has less variance in characteristics due to temperature, when formed into a device.

The piezoelectric material according to the present invention includes a perovskite-type composite oxide represented by the general formula (1):

$$xABO_3\text{-}yA'BO_3\text{-}zA"B'O_3 \qquad \text{General Formula (1)}$$

wherein A is a Bi element; A' is a rare earth element including La; B is at least one element selected from Ti, Zn, Sn and Zr; A" is at least one element selected from Ba, Sr and Ca; B' is at least one element selected from divalent, trivalent, pentavalent, tetravalent, and hexavalent elements; and x is 0.10 or more and 0.95 or less, y is 0 or more and 0.5 or less, and z is 0 or more and 0.7 or less, provided that x+y+z=1.

The rare earth element including La is La, Sc, Y, Ce, Pr, Nd, Sm, Dy or Yb, preferably La, Y, Ce, Sm or Nd, and more preferably La or Ce for easier inclusion in the A site.

The piezoelectric material of the present invention is more preferably a lead-free piezoelectric material wherein A is a Bi element; A' is a rare earth element including La; and B is $(Zn_{0.5}, Ti_{0.5})$. This is because Bi $(Zn_{0.5}, Ti_{0.5})$ $O_3$ is a piezoelectric material having a higher Curie temperature than that of Bi $(Zn_{0.5}, Zr_{0.5})$ $O_3$ or Bi $(Zn_{0.5}, Sn_{0.5})$ $O_3$, but B may be $(Zn_{0.5}, Zr_{0.5})$ or $(Zn_{0.5}, Sn_{0.5})$.

The above $ABO_3$-$A'BO_3$ material of the present invention takes a tetragonal crystal structure. A non-tetragonal crystal material, when selected as $A''B'O_3$, forms a morphotropic phase boundary with this tetragonal crystal material.

B' in the $A''B'O_3$ compound is preferably at least one divalent to hexavalent element selected from $Sc^{3+}$, $Fe^{3+}$, $Yb^{3+}$, $MgTi^{2+}$, $Mn^{2+}$, $Mn^{3+}$, $Co^{2+}$, $Zn^{2+}$, $In^{3+}$, $Ti^{4+}$, $Zr^{4+}$, $Sn^{4+}$, $Nb^{5+}$, $Ta^{5+}$ and $Te^{6+}$.

Specifically, $A''B'O_3$ is $BaZrO_3$, $BaSnO_3$, Ba $(In_{0.5}, Nb_{0.5})$ $O_3$, Ba $(In_{0.5}, Ta_{0.5})$ $O_3$, Ba $(Mg_{0.5}, Te_{0.5})$ $O_3$, Ba $(Mn_{0.5}, Te_{0.5})$ $O_3$, Ba $(CO_{0.5}, Te_{0.5})$ $O_3$, Ba $(Mg_{0.33}, Nb_{0.67})$ $O_3$, Ba $(Zn_{0.33}, Nb_{0.67})$ $O_3$, Ba $(Sc_{0.5}, Nb_{0.5})$ $O_3$, Ba $(Fe_{0.5}, Nb_{0.5})$ $O_3$, Ba $(Fe_{0.5}, Ta_{0.5})$ $O_3$, Ba $(Yb_{0.5}, Nb_{0.5})$ $O_3$, (Ba, Ca) $(Sn_{0.5}, Ti_{0.5})$ $O_3$, (Ba, Ca) $(Zr_{0.5}, Ti_{0.5})$ $O_3$, or (Ba, Sr) $(Zr_{0.5}, Ti_{0.5})$ $O_3$.

Thus, $ABO_3$-$A'BO_3$ and $A''B'O_3$ form a morphotropic phase boundary region to develop excellent piezoelectric characteristics.

The piezoelectric material in the present invention is preferably a perovskite-type composite oxide that is a material wherein A is Bi, B is $(Zn_{0.5}, Ti_{0.5})$, and $A''B'O_3$ is $BaTiO_3$, which is represented by the following general formula (2):

$x\text{Bi}(Zn_{0.5},Ti_{0.5})O_3\text{-}y\text{RE}(Zn_{0.5},Ti_{0.5})O_3\text{-}z\text{BaTiO}_3$ General Formula (2)

In the general formula, RE is a rare earth element including La.

The perovskite-type composite oxide represented by the general formula (2) wherein x+y+z=1 is preferably a piezoelectric material wherein the values of (x, y, z) are within the range of molar ratios surrounded by a, b, c, d, e, f, and g represented by a (0.40, 0.00, 0.60), b (0.26, 0.08, 0.66), c (0.20, 0.20, 0.60), d (0.30, 0.44, 0.26), e (0.52, 0 39, 0.09), f (0.70, 0.24, 0.06) and g (0.90, 0.00, 0.10).

It is known that a single material of Bi $(Zn_{0.5}, Ti_{0.5})$ $O_3$ must be sintered under an extremely high pressure (about 6 GPa). In the present invention, by using Bi $(Zn_{0.5}, Ti_{0.5})$ $O_3$ in a ternary system, a piezoelectric material that is excellent in piezoelectric characteristics can be obtained without conducting a high-pressure synthesis that is the issue peculiar to Bi $(Zn_{0.5}, Ti_{0.5})$ $O_3$. Furthermore, the resulting piezoelectric material also has a high Curie temperature, which is a characteristic feature of Bi $(Zn_{0.5}, Ti_{0.5})$ $O_3$. Typical $ABO_3$ is Bi $(Zn_{0.5}, Ti_{0.5})$ $O_3$, and $A'BO_3$ is preferably La $(Zn_{0.5}, Ti_{0.5})$ $O_3$. By combining them, their sintering properties are changed so that intended ceramics can be prepared by synthesis at ordinary pressures.

Particularly, $A'BO_3$ used in combination with $ABO_3$ whose element B is identical with B in $A'BO_3$ is advantageous in usability with its tetragonal crystal structure being maintained. The tetragonal crystal material thus obtained may be combined with a non-tetragonal crystal material to form a morphotropic phase boundary, thereby improving the piezoelectric characteristics.

The resulting tetragonal material may be combined with another tetragonal crystal material.

Preferable examples of the non-tetragonal crystal material represented by $A''B'O_3$ in the general formula (2) include Ba $(In_{0.5}, Nb_{0.5})$ $O_3$, Ba $(In_{0.5}, Ta_{0.5})$ $O_3$, Ba $(Mg_{0.5}, Te_{0.5})$ $O_3$, Ba $(Mn_{0.5}, Te_{0.5})$ $O_3$, Ba $(CO_{0.5}, Te_{0.5})$ $O_3$, Ba $(Mg_{0.33}, Nb_{0.67})$ $O_3$, Ba $(Zn_{0.33}, Nb_{0.67})$ $O_3$, Ba $(Sc_{0.5}, Nb_{0.5})$ $O_3$, Ba $(Fe_{0.5}, Nb_{0.5})$ $O_3$, Ba $(Fe_{0.5}, Ta_{0.5})$ $O_3$, Ba $(Yb_{0.5}, Nb_{0.5})$ $O_3$, (Ba, Ca) $(Sn_{0.5}, Ti_{0.5})$ $O_3$, (Ba, Ca) $(Zr_{0.5}, Ti_{0.5})$ $O_3$, and (Ba, Sr) $(Zr_{0.5}, Ti_{0.5})$ $O_3$. Examples of the tetragonal crystal material include $BaTiO_3$, Ba $(Cu_{0.33}, Nb_{0.67})$ $O_3$ and Ba $(Cu_{0.33}, Ta_{0.67})$ $O_3$.

From the viewpoint of more excellent dielectric strength (insulation properties), more preferable examples of the non-tetragonal crystal material of $A''B'O_3$ include Ba $(In_{0.5}, Nb_{0.5})$ $O_3$, Ba $(In_{0.5}, Ta_{0.5})$ $O_3$, Ba $(Mg_{0.5}, Te_{0.5})$ $O_3$, Ba $(Mn_{0.5}, Te_{0.5})$ $O_3$, Ba $(Mg_{0.33}, Nb_{0.67})$ $O_3$, Ba $(Zn_{0.33}, Nb_{0.67})$ $O_3$, Ba $(Sc_{0.5}, Nb_{0.5})$ $O_3$, Ba $(Yb_{0.5}, Nb_{0.5})$ $O_3$, and (Ba, Ca) $(Zr_{0.5}, Ti_{0.5})$ $O_3$, while more preferable examples of the tetragonal crystal material include $BaTiO_3$.

With respect to x, y and z in the combination with a non-tetragonal crystal material, it is preferable that x is 0.1 or more and 0.8 or less, y is 0.1 or more and 0.5 or less and z is 0.1 or more and 0.6 or less, provided that x+y+z=1, and it is more preferable that x is 0.2 or more and 0.5 or less, y is 0.1 or more and 0.4 or less, and z is 0.2 or more and 0.5 or less. When x, y and z are in the above ranges, a balance can be struck between a high Curie temperature and excellent piezoelectric characteristics.

Figure 1:
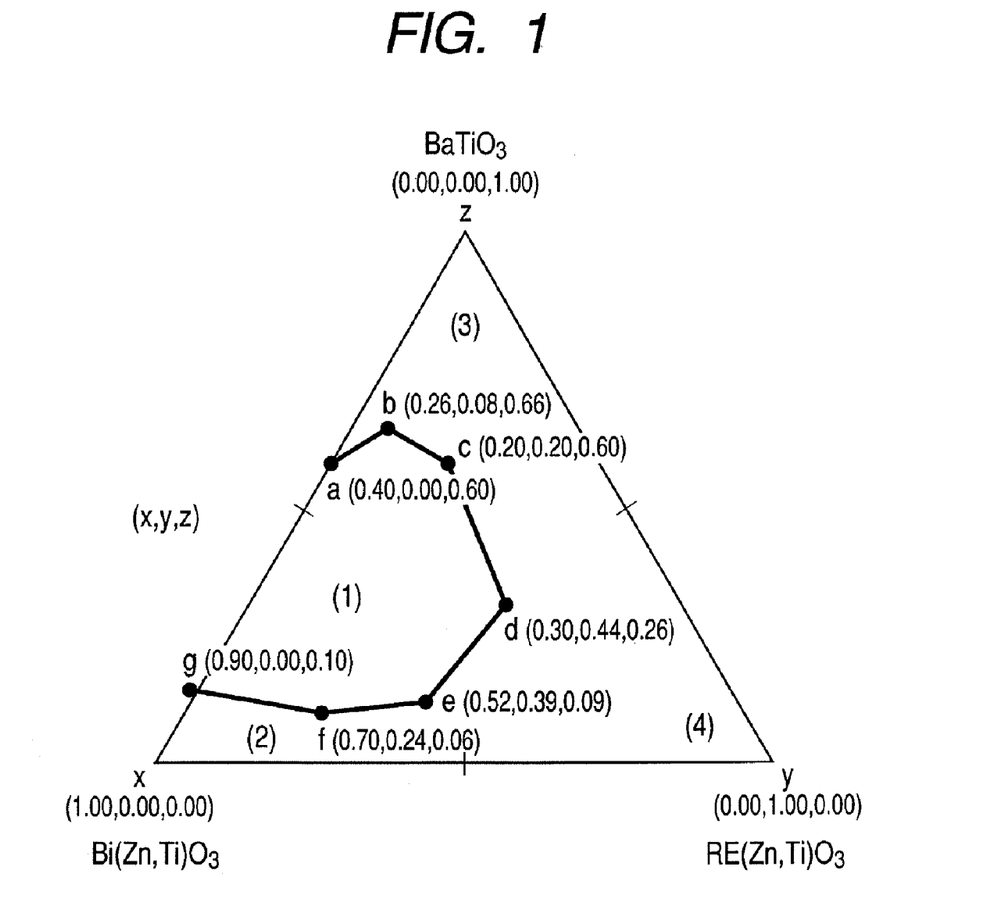
FIG. 1 is a phase diagram of a piezoelectric material in accordance with the present invention.

Hereinafter, x, y and z in the combination with the tetragonal crystal material are described with reference to the phase diagram shown in FIG. 1. FIG. 1 is a phase-diagram example of a piezoelectric material of the present invention, which is related to a Bi $(Zn_{0.5}, Ti_{0.5})$ $O_3$—RE $(Zn_{0.5}, Ti_{0.5})$ $O_3$—$BaTiO_3$ piezoelectric material. The area surrounded by a, b, c, d, e, f and g in FIG. 1 (that is, the area (1) in FIG. 1) is an area in which the Curie temperature is 200° C. or more and simultaneously piezoelectricity has been confirmed. In this area, a change in the Curie temperature is slow with respect to a change in the composition, so that there is an advantage of less change in the temperature characteristics. For example, the Curie temperature at the point (0.35, 0.15, 0.50) in FIG. 1 is 250° C. Moreover, the Curie temperatures both at (0.36, 0.24, 0.40) and at (0.47, 0.11, 0.42) in FIG. 1 are 200° C. In addition, in the area (1), there is another advantage that a single phase can be easily obtained.

The area (area (2) in FIG. 1) extending from a line connecting e, f and g over an area with a lower compositional ratio of $BaTiO_3$ is an area in which the Curie temperature is higher than 200° C., but a single phase is hardly obtainable and impurity phases that is not perovskite may also present. The impurity phases are preferably not present for reducing electrical loss, but in this compositional range, there arises no significant problem when applied to devices.

Figure 2:
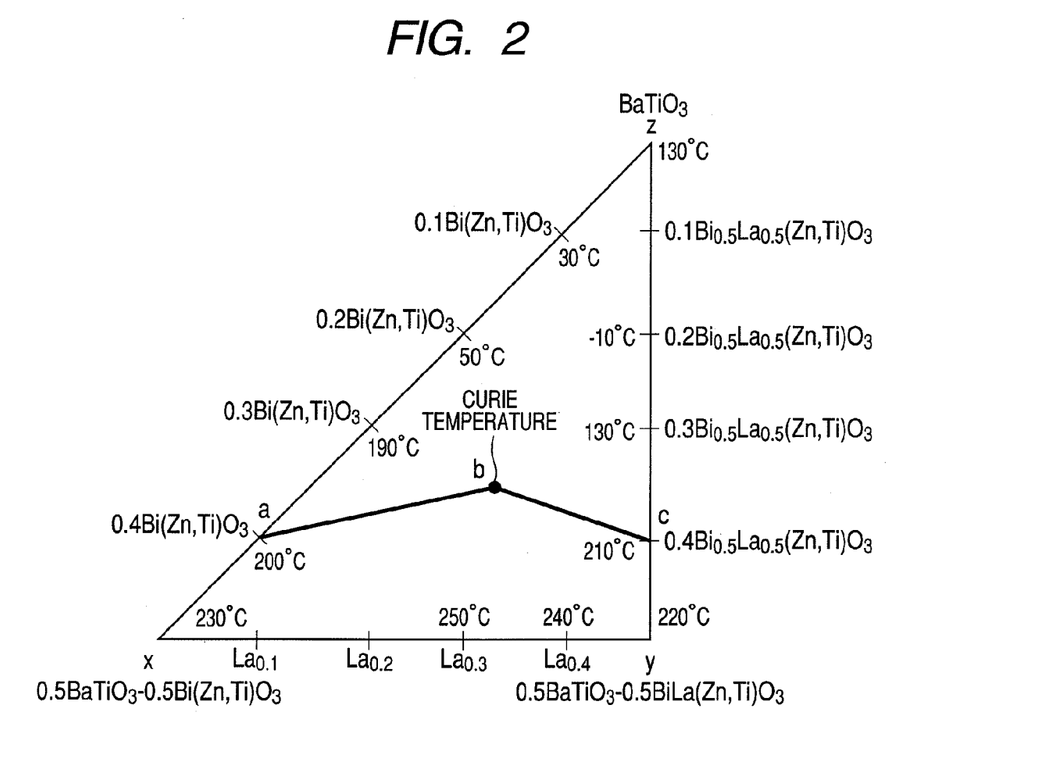
FIG. 2 is a diagram showing the relationship between the composition of $BaTiO_3$, Bi $(Zn_{0.5}, Ti_{0.5}) O_3$ and $(Bi_{0.5}, La_{0.5})$  $(Zn_{0.5}, Ti_{0.5}) O_3$ and Curie temperature.

Furthermore, the area (area (3) in FIG. 1) extending from a line connecting a, b and c over an area with a larger compositional ratio of $BaTiO_3$ is an area of low Curie temperature. FIG. 2 is a diagram showing the relationship between the compositions of $BaTiO_3$, Bi $(Zn_{0.5}, Ti_{0.5})$ $O_3$ and $(Bi_{0.5}, La_{0.5})$ $(Zn_{0.5}, Ti_{0.5})$ $O_3$ and Curie temperatures. For example, as shown in FIG. 2, the Curie temperature is 50° C. at the point in the compositional ratio (0.20, 0.00, 0.80) and is decreased to 30° C. at the point in the compositional ratio (0.10, 0.00, 0.90), which is not preferable from the viewpoint of Curie temperature. In FIG. 2, a, b, and c refer to points corresponding respectively to a, b, and c in FIG. 1.

In addition, the area (area (4) in FIG. 1) extending from a line connecting c, d and e over an area with a larger amount of RE ($Zn_{0.5}$, $Ti_{0.5}$) $O_3$ is not preferable because both Curie temperature and piezoelectric characteristics lower in this area.

The piezoelectric material of the present invention may be either a bulk body or a thin film. The piezoelectric material of the present invention may be a preferentially oriented material. When the piezoelectric material of the present invention is in a shape of a thin film of 1 to 10 μm in thickness, the film may be not only a preferentially oriented film but also an epitaxial film.

When the piezoelectric material is oriented, the orientation is preferably a (100) orientation, (110) orientation or (111) orientation in a pseudo cubic system expression. In such film excellent in crystallinity, a morphotropic phase boundary region having crystal phases in mixture therein can be confirmed by Raman spectrometry.

When the piezoelectric material is oriented, the degree of orientation evaluated in terms of Lotgering factor is 40% or more, preferably 60% or more.

When the piezoelectric material is used as a thin film, Examples of the substrate used therein includes a Si substrate, a SUS substrate, a glass substrate, a MgO substrate, a $SrTiO_3$ substrate, a $Nb:SrTiO_3$ substrate, and a $La:SrTiO_3$ substrate. Particularly for use as an epitaxial film, a single-crystal substrate such as a Si substrate or a MgO substrate is preferable.

The method of producing the thin film includes a sol-gel method, a sputtering method, a chemical vapor deposition method, and an aerosol deposition method.

As the method of producing a bulk body of the piezoelectric material in the present invention, there may be used general methods of sintering powder at ordinary pressures. However, other methods such as a conduction heating method, a microwave sintering method, a millimeter-wave sintering method, and a hot isostatic pressing can also be used.

The powder preferably has a composition containing an element in the A site in an amount equal to or larger than that of an element in the B site.

For obtaining a bulk body having controlled orientation, a particle orientation production method using magnetic field orientation or orientated particles can be used. The material that can be used in the particle orientation production method includes a Bi layered compound and $BaTiO_3$ plate-like particles.

The grain size of the bulk body, in terms of average grain size, is 0.1 μm to 50 μm, preferably 0.5 μm to 20 μm. When the grain size is more than 50 μm, the bulk body may be poor in mechanical strength. On the other hand, when the grain size is less than 0.1 μm, the density of the bulk body may not be sufficiently high.

The electrode used for application of the piezoelectric material of the present invention to devices may be a metal electrode or an oxide electrode. The metal electrode includes electrodes made of Au, Pt, Ir, Ru, Ni, Ag, Cu, Cr, Ti, Pd, and Al. The oxide electrode includes electrodes made of $IrO_2$, $RuO_2$, $PtO_2$, $PdO_2$, $SrRuO_3$, $LaCrO_3$, $LaNiO_3$, and $CaRuO_3$. These materials may be stacked upon each other.

Particularly for obtaining a (100) oriented film, a configuration of $SrRuO_3$ (100)/$LaNiO_3$ (100)/Pt (111)/substrate is preferable. For obtaining a (110) oriented film, a configuration of $SrRuO_3$ (110)/YSZ (100)/substrate is preferable. For (111) orientation, a $SrRuO_3$ (111)/Pt (111)/substrate is preferable. In place of Pt in the above configuration, another face-centered cubic crystal metal can also be used.

The device in which the piezoelectric material of the present invention is used can include ultrasonic transducers, piezoelectric sensors, actuators and the like.

EXAMPLES

Hereinafter, the present invention is described in more detail with reference to Examples.

Examples 1 to 11

Examples of $xBi$ ($Zn_{0.5}$, $Ti_{0.5}$) $O_3$-$yLa$ ($Zn_{0.5}$, $Ti_{0.5}$) $O_3$-$zBa$ ($Sc_{0.5}$, $Nb_{0.5}$) $O_3$ $Bi_2O_3$, ZnO, $TiO_2$, $La_2O_3$, $BaCO_3$, $Sc_2O_3$, and $Nb_2O_5$ were used as oxide materials and weighed out to constitute each of the objective compositions, mixed and pulverized. About 5 g of the prepared powder was weighed out, and a solution of PVB (polyvinyl butyral) was added as a binder in an amount of 5 to 10 wt % in terms of solid content to the powder, then mixed in a mortar, dried, pulverized, molded into a disk having a diameter of 10 mm, calcined then fired to give a piezoelectric body.

The calcination was conducted at 700° C. for 2 hours, and the firing was conducted at 1100 to 1350° C. for 2 hours. The piezoelectric body was polished into a disk shape, then provided with a silver paste to form electrodes, and subjected to poling procedure with a field strength of 1 kV/mm under heating at 100° C. in silicon oil. Respective samples of the piezoelectric materials thus prepared by changing the composition of the raw materials were measured for its piezoelectric characteristics with a $d_{33}$ meter. In this measurement, the temperature was 25° C., and a voltage from 0.5 to 2.0 kV was applied.

The results are shown together with the compositions in Table 1.

TABLE 1

| | x | y | z | Piezoelectric Characteristics (pm/V) | Curie Temperature (° C.) |
|---|---|---|---|---|---|
| Example 1 | 0.2 | 0.2 | 0.6 | 100 | 190 |
| Example 2 | 0.3 | 0.2 | 0.5 | 130 | 190 |
| Example 3 | 0.4 | 0.2 | 0.4 | 140 | 200 |
| Example 4 | 0.3 | 0.3 | 0.4 | 130 | 190 |
| Example 5 | 0.3 | 0.4 | 0.3 | 140 | 190 |
| Example 6 | 0.4 | 0.4 | 0.2 | 130 | 200 |
| Example 7 | 0.4 | 0.5 | 0.1 | 100 | 170 |
| Example 8 | 0.1 | 0.4 | 0.5 | 90 | 160 |
| Example 9 | 0.4 | 0.1 | 0.5 | 90 | 190 |
| Example 10 | 0.5 | 0.1 | 0.4 | 60 | 210 |

As can be seen from Table 1, the excellent piezoelectric characteristics of the product samples as piezoelectric materials were confirmed. As temperature characteristics, the dielectric constant of each sample was then measured with an impedance analyzer in order to determine the Curie temperature. In this measurement, the frequency was 1 kHz, the applied voltage was 1.0 V, and the temperature was changed from −50° C. to 350° C. From the dielectric constant characteristics, the Curie temperature was determined. It can be seen from Table 1 that the Curie temperatures of each sample is higher than 150° C.

Example 11

Example of $0.3\text{Bi}(\text{Zn}_{0.5}, \text{Ti}_{0.5})\text{O}_3\text{-}0.3\text{La}(\text{Zn}_{0.5}, \text{Ti}_{0.5})\text{O}_3\text{-}0.4\text{Ba}(\text{Mg}_{0.33}, \text{Nb}_{0.67})\text{O}_3$ $\text{Bi}_2\text{O}_3$, ZnO, $\text{TiO}_2$, $\text{La}_2\text{O}_3$, $\text{BaCO}_3$, MgO, and $\text{Nb}_2\text{O}_5$ were used as oxide materials and weighed out to constitute the objective composition, mixed and pulverized. 15 g of the prepared powder was weighed out and calcined at 900° C. for 2 hours. The calcined powder was pressed with a pressing machine for 10 minutes to give a piezoelectric body. The piezoelectric body was used as a target to form a thin film with the above composition by high frequency magnetron sputtering.

As the substrate, $\text{SrRuO}_3$ (110)/YSZ (100)/Si (100) was used. YSZ is a $\text{ZrO}_2$ epitaxial film containing 3.5% Y, to form the substrate having an oxide electrode $\text{SrRuO}_3$ formed on the YSZ. A (110) piezoelectric film of 3 μm in thickness was formed at a substrate temperature of 650° C. at a gas pressure of 0.5 Pa in a mixed-gas atmosphere of Ar and $\text{O}_2$. An upper electrode was prepared by depositing Pt in a thickness of 100 nm by DC sputtering and subsequent heat treatment at 400° C. with a desktop lamp heater.

The resulting film was confirmed to be crystalline with an X-ray diffractometer and thus confirmed to be an epitaxial film. By evaluation of electric characteristics, a remanent polarization value of 5 μC/cm² was measured, and the film was thus confirmed to be a piezoelectric body. When the crystal phase was evaluated with Raman spectroscopy, a morphotropic phase boundary region having a tetragonal phase and a non-tetragonal phase mixed therein was confirmed from the oscillation mode.

Examples 12 to 21

Examples of $x\text{Bi}(\text{Zn}_{0.5}, \text{Ti}_{0.5})\text{O}_3\text{-}y\text{La}(\text{Zn}_{0.5}, \text{Ti}_{0.5})\text{O}_3\text{-}z\text{Ba}(\text{Mg}_{0.5}, \text{Te}_{0.5})\text{O}_3$ $\text{Bi}_2\text{O}_3$, ZnO, $\text{TiO}_2$, $\text{La}_2\text{O}_3$, $\text{BaCO}_3$, MgO, and $\text{TeO}_3$ were used as oxide materials and weighed out to constitute each of the objective compositions, mixed and pulverized. About 5 g of the prepared powder was weighed out, and a solution of PVB (polyvinyl butyral) was added as a binder in an amount of 5 to 10 wt % in terms of solid content to the powder, then mixed in a mortar, dried, pulverized, molded into a disk having a diameter of 10 mm, calcined and then fired to give a piezoelectric body. The calcination was conducted at 650° C. for 2 hours, and the firing was conducted at 1000° C. to 1350° C. The piezoelectric body was polished into a disk shape, then provided with a silver paste to form electrodes, and subjected to poling procedure with a field strength of 2 kV/mm under heating at 80° C. in silicon oil.

The prepared compositions and the results are summarized in Table 2. The piezoelectric constants in the table were measured with a $d_{33}$ meter.

TABLE 2

| Sample | x | y | z | Piezoelectric Characteristics (pm/V) | Curie Temperature (° C.) |
|---|---|---|---|---|---|
| Example 12 | 0.2 | 0.2 | 0.6 | 110 | 160 |
| Example 13 | 0.3 | 0.2 | 0.5 | 110 | 180 |
| Example 14 | 0.4 | 0.2 | 0.4 | 120 | 190 |
| Example 15 | 0.3 | 0.3 | 0.4 | 130 | 170 |
| Example 16 | 0.3 | 0.4 | 0.3 | 140 | 200 |
| Example 17 | 0.4 | 0.4 | 0.2 | 140 | 200 |
| Example 18 | 0.4 | 0.5 | 0.1 | 110 | 190 |
| Example 19 | 0.1 | 0.4 | 0.5 | 90 | 180 |
| Example 20 | 0.4 | 0.1 | 0.5 | 90 | 210 |
| Example 21 | 0.5 | 0.1 | 0.4 | 80 | 210 |
| Comparative Example 1 | 0.1 | 0.1 | 0.8 | 70 | 50 |

From Table 2, it was confirmed that the above materials could be used as piezoelectric materials. The Curie temperature of each sample was 150° C. or more, and the samples did not give rise to depolarization until their Curie temperatures were reached.

Comparative Example 1

Example of $0.1\text{Bi}(\text{Zn}_{0.5}, \text{Ti}_{0.5})\text{O}_3\text{-}0.1\text{La}(\text{Zn}_{0.5}, \text{Ti}_{0.5})\text{O}_3\text{-}0.8\text{Ba}(\text{Mg}_{0.5}, \text{Te}_{0.5})\text{O}_3$ A piezoelectric body was prepared by following the same procedure as in Examples 12 to 21. The product had a Curie temperature of 50° C. and lost piezoelectric property upon a slight increase in temperature from room temperature.

Examples 23 to 44

Examples of $x\text{Bi}(\text{Zn}_{0.5}, \text{Ti}_{0.5})\text{O}_3\text{-}y\text{La}(\text{Zn}_{0.5}, \text{Ti}_{0.5})\text{O}_3\text{-}z\text{BaTiO}_3$

Examples 23 to 29 wherein y=0

$\text{Bi}_2\text{O}_3$, ZnO, $\text{TiO}_2$, and $\text{BaCO}_3$ were used as oxide materials and weighed out to constitute each of the objective compositions, mixed and encapsulated into a gold capsule. Thereafter, this capsule was pressurized at 6 GPa in an ultrahigh-pressure generator and heated at 1200° C. After reaction for 60 minutes, the sample was cooled and taken out.

Examples 30 to 44 wherein y≠0

$\text{Bi}_2\text{O}_3$, ZnO, $\text{TiO}_2$, $\text{La}_2\text{O}_3$, and $\text{BaCO}_3$ were used as oxide materials and weighed out to constitute each of the objective compositions, mixed and pulverized. About 5 g of the prepared powder was weighed out, and a solution of PVB (polyvinyl butyral) was added as a binder in an amount of 5 to 10 wt % in terms of solid content to the powder and then mixed in a mortar. The mixture was dried, then pulverized, molded into a disk having a diameter of 10 mm, calcined and fired to give a piezoelectric body. The calcination was conducted at 650° C. for 2 hours, and the firing was conducted at 1000° C. to 1350° C. for 2 hours.

Each sample was polished into a disk shape, then provided with a silver paste to form electrodes, and subjected to poling procedure with a field strength of 1.5 kV/mm under heating at 100° C. in silicon oil.

Figure 3:
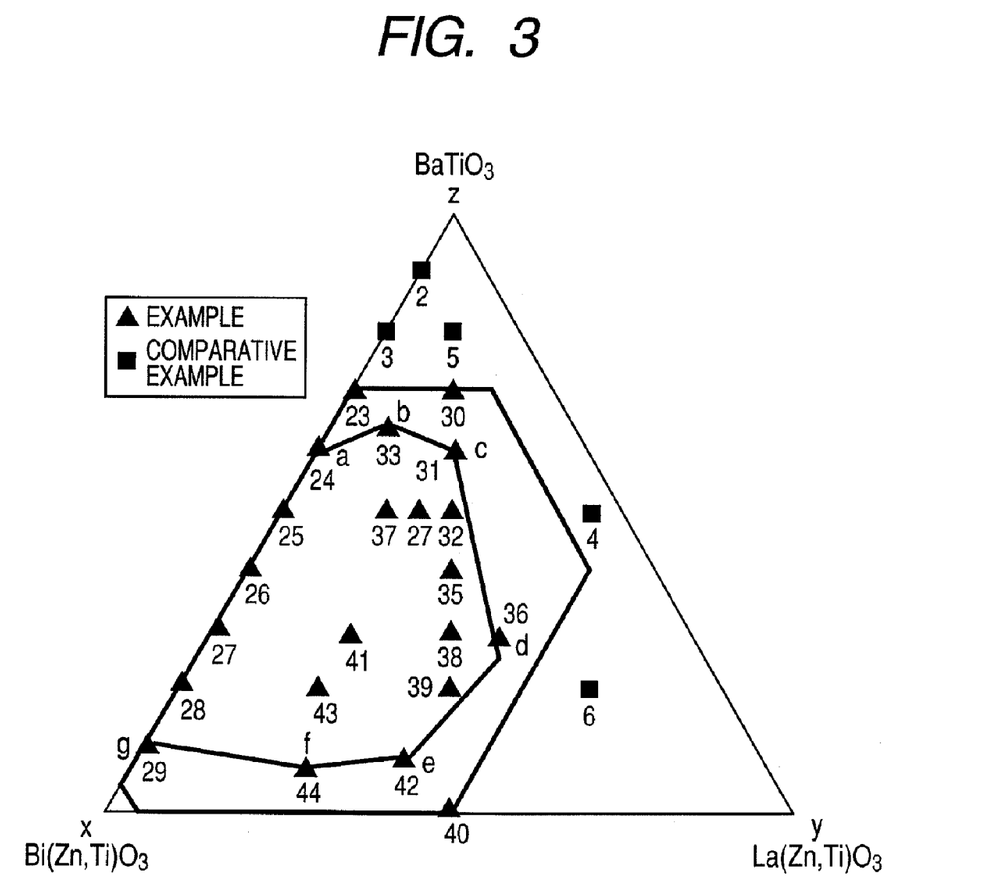
FIG. 3 is a diagram showing the composition of the respective samples shown in Table 3.

The piezoelectric characteristics and Curie temperature of each sample of the piezoelectric materials thus prepared by changing the composition of the raw materials are shown in Table 3 and FIG. 3. The piezoelectric characteristics and Curie temperatures were measured in the same manner as in the other Examples. FIG. 3 is a diagram showing the composition of each sample shown in Table 3.

TABLE 3

| Sample | x | y | z | Piezoelectric Characteristics (pm/V) | Curie Temperature (° C.) |
|---|---|---|---|---|---|
| Example 23 | 0.3 | 0 | 0.7 | 170 | 190 |
| Example 24 | 0.4 | 0 | 0.6 | 250 | 200 |
| Example 25 | 0.5 | 0 | 0.5 | 225 | 230 |
| Example 26 | 0.6 | 0 | 0.4 | 135 | 240 |
| Example 27 | 0.7 | 0 | 0.3 | 100 | 200 |
| Example 28 | 0.8 | 0 | 0.2 | 70 | 240 |
| Example 29 | 0.9 | 0 | 0.1 | 70 | 240 |
| Comparative Example 2 | 0.1 | 0 | 0.9 | 80 | 30 |
| Comparative Example 3 | 0.2 | 0 | 0.8 | 90 | 50 |
| Example 30 | 0.15 | 0.15 | 0.7 | 65 | 190 |
| Example 31 | 0.2 | 0.2 | 0.6 | 100 | 210 |
| Example 32 | 0.25 | 0.25 | 0.5 | 105 | 220 |
| Example 33 | 0.26 | 0.08 | 0.66 | 160 | 200 |
| Example 34 | 0.3 | 0.2 | 0.5 | 135 | 240 |
| Example 35 | 0.3 | 0.3 | 0.4 | 100 | 200 |
| Example 36 | 0.3 | 0.44 | 0.26 | 90 | 200 |
| Example 37 | 0.35 | 0.15 | 0.5 | 180 | 250 |
| Example 38 | 0.35 | 0.35 | 0.3 | 165 | 205 |
| Example 39 | 0.4 | 0.4 | 0.2 | 130 | 210 |
| Example 40 | 0.5 | 0.5 | 0 | 80 | 170 |
| Example 41 | 0.5 | 0.2 | 0.3 | 140 | 215 |
| Example 42 | 0.52 | 0.39 | 0.09 | 85 | 200 |
| Example 43 | 0.6 | 0.2 | 0.2 | 115 | 205 |
| Example 44 | 0.7 | 0.24 | 0.06 | 90 | 240 |
| Comparative Example 4 | 0.05 | 0.45 | 0.5 | x | −30 |
| Comparative Example 5 | 0.1 | 0.1 | 0.8 | x | −10 |
| Comparative Example 6 | 0.2 | 0.6 | 0.2 | x | −20 |

From Table 3, it was confirmed that the above materials could be used as piezoelectric materials. It can be seen that the Curie temperatures in the Examples are 150° C. or more. The polarization was not lost until the Curie temperature was reached. There is no problem even when the Bi $(Zn_{0.5}, Ti_{0.5}) O_3$ content x is made slightly larger than 0.9 by a shift in composition resulting from volatilization of specific elements during production of the piezoelectric body.

From the phase diagram shown in FIG. 3, it can be seen that any samples having a composition in the area surrounded by a, b, c, d, e, f and g have a Curie temperature of 200° C. or more and are excellent in piezoelectric characteristics.

Further, plate-like particles having a composition wherein x=0.30, y=0.20, and z=0.50 were used to prepare a piezoelectric material oriented in (110). When the degree of orientation was 40%, the piezoelectric characteristics were increased by about 20%. It was also confirmed that when the degree of orientation in a sample with the same composition was increased to 60%, the piezoelectric characteristics was increased by 35% or more. The grain size of this material was 20 μm in terms of average grain size.

Comparative Examples 2 and 3

These samples were prepared by following the same procedure as in Examples 23 to 29.

The Curie temperatures of the resulting piezoelectric bodies were as low as 30° C. when x=0.1 and z=0.9 (Comparative Example 2) and 50° C. when x=0.2 and z=0.8 (Comparative Example 3), and these Curie temperatures were lower than that of $BaTiO_3$.

Comparative Examples 4 to 6

These samples were prepared by following the same procedure as in Examples 30 to 44.

The crystalline structures of the resulting piezoelectric bodies were all cubic crystal at room temperature, and the Curie temperatures were room temperature or less. From this result, it can be seen that the Curie temperature is decreased within the range of a smaller content of Bi $(Zn_{0.5}, Ti_{0.5}) O_3$.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-072321, filed Mar. 19, 2008, which is hereby incorporated by reference herein in its entirety.

The invention claimed is:

1. A piezoelectric material comprising a perovskite-type composite oxide represented by the general formula (1):

$$xABO_3\text{-}yA'BO_3\text{-}zA''B'O_3$$

wherein A is a Bi element; A' is a rare earth element including La; B is at least two elements including Ti and Zn and is selected from Ti, Zn, Sn and Zr; A" is at least one element selected from Ba, Sr and Ca; B' is at least one element selected from divalent, trivalent, pentavalent, tetravalent, and hexavalent elements; and x is a value of 0.10 or more and 0.95 or less, y is a value of more than 0 and 0.5 or less, and z is a value of 0 or more and 0.7 or less, provided that x+y+z=1.

2. The piezoelectric material according to claim 1, wherein B is Zn and Ti.

3. The piezoelectric material according to claim 2, wherein B' in the A"B'$O_3$ is at least one element selected from $Sc^{3+}$, $Fe^{3+}$, $Yb^{3+}$, $Mg^{2+}$, $Mn^{2+}$, $Mn^{3+}$, $Co^{2+}$, $Zn^{2+}$, $In^{3+}$, $Ti^{4+}$, $Zr^{4+}$, $Sn^{4+}$, $Nb^{5+}$, $Ta^{5+}$, and $Te^{6+}$.

4. The piezoelectric material according to claim 2, wherein the A"B'$O_3$ is $BaTiO_3$.

5. The piezoelectric material according to claim 4, wherein the perovskite-type composite oxide represented by the general formula (1) wherein x+y+z=1 has a composition wherein the values of (x, y, z) are within the range of molar ratios surrounded by b, c, d, e, and f represented by b (0.26, 0.08, 0.66), c (0.20, 0.20, 0.60), d (0.30, 0.44, 0.26), e (0.52, 0.39, 0.09), and f (0.70, 0.24, 0.06).

* * * * *

UNITED STATES PATENT AND TRADEMARK OFFICE
CERTIFICATE OF CORRECTION

PATENT NO.        : 8,034,250 B2
APPLICATION NO.   : 12/922824
DATED             : October 11, 2011
INVENTOR(S)       : Jumpei Hayashi et al.

It is certified that error appears in the above-identified patent and that said Letters Patent is hereby corrected as shown below:

TITLE PAGE (73), Assignee:

"Canon Kabushiki Kaisha, Tokyo (JP)" should read
--Canon Kabushiki Kaisha, Tokyo (JP)
University of Yamanashi, Kofu-shi (JP)
Kyoto University, Kyoto-shi (JP)
Tokyo Institute of Technology, Tokyo (JP)
National Institute of Advanced Industrial Science and Technology, Tokyo (JP)
Tokyo University of Science Educational Foundation Administrative
Organization, Tokyo (JP)--.

Signed and Sealed this
Thirteenth Day of December, 2011

David J. Kappos
*Director of the United States Patent and Trademark Office*